United States Patent
Hsu

(10) Patent No.: US 7,351,916 B2
(45) Date of Patent: Apr. 1, 2008

(54) THIN CIRCUIT BOARD

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/295,203

(22) Filed: Dec. 5, 2005

(65) Prior Publication Data

US 2007/0125572 A1    Jun. 7, 2007

(30) Foreign Application Priority Data

Feb. 4, 2005    (TW) .............................. 94103565 A

(51) Int. Cl.
*H05K 1/16* (2006.01)
(52) U.S. Cl. ...................... 174/260; 257/737
(58) Field of Classification Search ................ 174/260, 174/262–266; 361/767–771, 782–783; 257/690, 257/737, 738
See application file for complete search history.

(56) References Cited

U.S. PATENT DOCUMENTS 5,574,630 A * 11/1996 Kresge et al. .............. 361/792
5,915,169 A * 6/1999 Heo .......................... 438/118
6,281,448 B1 * 8/2001 Tsukamoto ................. 174/260
6,784,376 B1 * 8/2004 Huemoeller et al. ........ 174/262
6,800,815 B1 * 10/2004 Ehlert et al. ................ 174/262
2004/0000968 A1 * 1/2004 White et al. ................ 333/185
2005/0252682 A1 * 11/2005 Shimoto et al. ............ 174/260

* cited by examiner

*Primary Examiner*—Jeremy C Norris
(74) *Attorney, Agent, or Firm*—Sawyer Law Group LLP

(57) ABSTRACT

A thin circuit board includes a dielectric layer with at least one cavity formed on a surface thereof; a metal pad formed in the cavity; at least one circuit layer formed on another surface of the dielectric layer; and a plurality of conductive vias formed in the dielectric layer to electrically connect the circuit layer to the metal pad. A build-up circuit structure is formed on the surface of the dielectric layer where the circuit layer is formed, and a conductive element is formed on a surface of the metal pad, so as to form a single-sided build-up circuit structure that prevents the use of a core board. Therefore, the thickness of the circuit board can be reduced and the impedance of the circuit board can also be reduced due to elimination of the use of plated through holes.

13 Claims, 2 Drawing Sheets

THIN CIRCUIT BOARD

FIELD OF THE INVENTION

The present invention relates to thin circuit boards, and more particularly to a thin circuit board without a core board.

BACKGROUND OF THE INVENTION

Due to gradually reduced size and integrated multiple functions of electronic products, semiconductor packages are accordingly required high integration and miniaturization such as multi chip module packages that have become the mainstream technology in the market. Accordingly, multilayer circuit boards, on which active and passive components are mounted, also need to be formed with high density wiring patterns and interlayer connections to match high density integrated circuit.

FIG. 1 is a cross-sectional view of a prior art multilayer circuit board. As shown in FIG. 1, first, a plurality of through holes 11a is formed in a core board 11. Then, the core board 11 is plated to form conductive layers on both sides of the core board 11 and inner walls of the through holes 11a. The conductive layer on both sides of the core board 11 is subsequently patterned. As a result, circuit layers 12a and 12b are formed on both sides of the core board 11 and plated through holes 12c are formed inside the through holes 11a to electrically connect the circuit layers 12a and 12b. Build-up circuit structures 13 are formed respectively on the circuit layers 12a and 12b, which are electrically connected with each other through the plated through holes 12c. In this way, a multilayer circuit board 10 is formed.

Since the build-up circuit structures 13 on both sides of the core board 11 are electrically connected with each other through the plated through holes 12c, a core board is needed to be disposed between the build-up circuit structures 13, thereby increasing the thickness of the circuit board.

In addition, to form through holes in the core board, high cost drilling machines are needed, thereby increasing the fabrication cost. In general, there are two ways to form through holes: mechanical drilling and laser drilling. To form through holes by mechanical drilling, fine drilling bits are needed, which are easy to wear out and accordingly need to be changed periodically, thereby increasing the material cost. On the other hand, it is difficult to drill through the core board by laser drilling, especially to drill through the core board having multiple metal layers. Moreover, to effectively form conductive layer on inner walls of the plated through holes 12c, diameter of the through holes can not be too small, thereby increasing the difficulty of forming fine pitch high density package.

Moreover, long conductive path between the build-up circuit structures 13 on both sides of the core board 11 that are electrically connected through the plated through holes 12c and parasitic capacitance and inductance generated by long plated through holes introduce large impedance to the circuit board, which affects signal integrity especially of high frequency circuit. Further, the electrical performance of the circuit board is affected.

Furthermore, build-up circuit structures 13 are symmetrically formed on both sides of the core board 11, which sometimes introduce some of redundant circuit layers, thereby increasing the fabrication cost and also increasing the difficulty of forming thin circuit board.

Accordingly, there is a need to provide a thin circuit board, which can overcome the above drawbacks.

SUMMARY OF THE INVENTION

In light of the foregoing drawbacks of the prior art, a primary objective of the present invention is to provide a thin circuit board without a core board and plated through holes (PTH).

Another objective of the present invention is to provide a thin circuit board, which can reduce the impedance and enhance electrical performance by reducing the length of the conductive path such that the thin circuit board can be used in high frequency and high speed arithmetic products.

A further objective of the present invention is to provide a thin circuit board for fine pitch high density package.

To achieve the above and other objectives, the present invention discloses a thin circuit board, comprising: a dielectric layer with at least one cavity formed on a surface thereof; a metal pad formed in the cavity; at least one circuit layer formed on another surface of the dielectric layer; and at least one conductive via formed in the dielectric layer to electrically connect the circuit layer with the metal pad.

In addition, a build-up circuit structure is formed on the surface of the dielectric layer where the circuit layer is formed and a semiconductor device or a passive component is mounted to the surface of the build-up circuit layer. A conductive element can be mounted to the metal pad in the cavity for external electrical connection.

Because the metal pad and the circuit layer are respectively formed on two surfaces of the dielectric layer and electrically connected through conductive vias, the dielectric layer forms a basic construction of a circuit board without the need of the core board and plated through holes.

In addition, by eliminating the need of plated through holes, the length of the conductive path is reduced. Also, parasitic capacitance and inductance introduced by plated through holes are eliminated. As a result, the impedance of the thin circuit board is reduced and the electrical performance of the thin circuit board is enhanced. Therefore, the thin circuit board of the present invention is suitable to be applied to high frequency and high speed electronic products.

Moreover, compared with the prior art that needs to symmetrically dispose build-up structures at both sides of the circuit board, the present invention can form a single side build-up circuit structure, thereby avoiding bits circuit layer and reducing the fabrication cost.

Furthermore, by eliminating the need of plated through holes that have size limitation due to mechanical drilling, the present invention can provide thin circuit boards with fine pitch high density circuit.

DETAILED DESCRIPTION OF THE PREFERRED EMBODIMENTS

Preferred embodiments of a thin circuit board proposed in the present invention are described as follows with reference to FIGS. 2 to 6.

Figure 1:
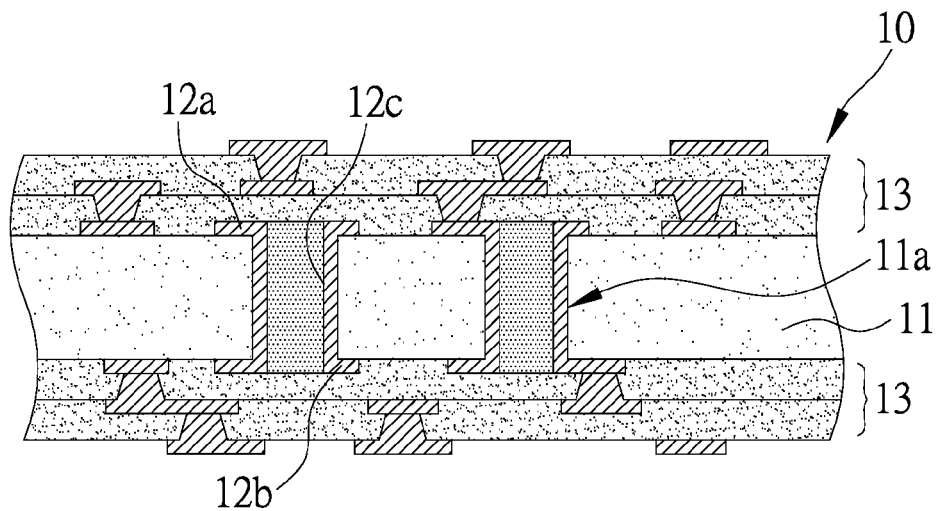
FIG. 1 (PRIOR ART) is a cross-sectional view of a conventional core board with build-up circuit structures formed on both sides thereof.
Figure 2:
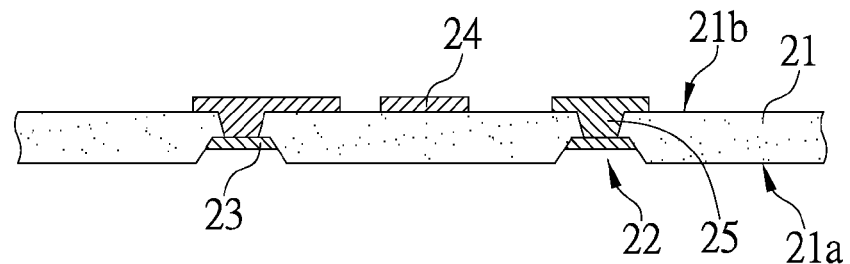
FIG. 2 is a cross-sectional view of a thin circuit board according to the present invention.

Referring to FIG. 2, a thin circuit board includes a dielectric layer 21 with at least one cavity 22 formed on a surface 21*a* thereof; a metal pad 23 formed in the cavity 22; at least one circuit layer 24 formed on another surface 21*b* of the dielectric layer 21; and at least one conductive via 25 formed in the dielectric layer 21 to provide electric connection between the circuit layer 24 and the metal pad 23. Therein, the dielectric layer 21 can be a rigid board or a flexible board formed of a dielectric material such as organic polymer material, ceramic material or polymer material filled with ceramic powders; the metal pad 23 can be formed of a metal or an alloy selected from the group consisting of gold (Au), nickel (Ni), palladium (Pd), silver (Ag), tin (Sn), Ni/Pd, chromium (Cr)/titanium (Ti), Ni/Au, copper (Cu)/Ni/Au, Pd/Au, Ni/Pd/Au, Cu, Cr, Ti, Cu/Cr, and Sn/lead (Pb).

First Embodiment

Figure 3:
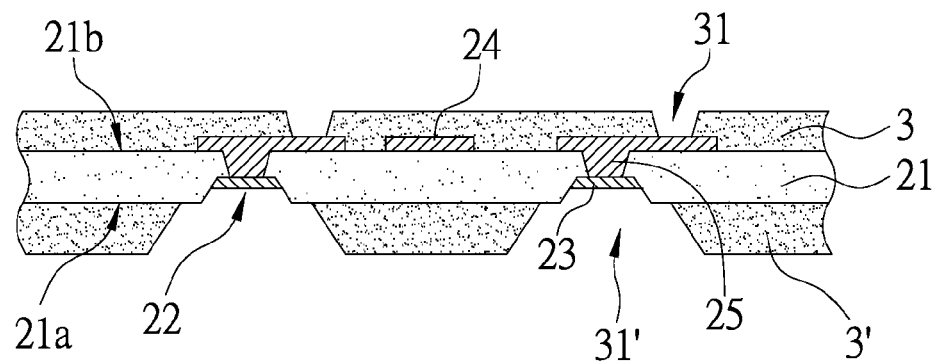
FIG. 3 is a cross-sectional view of a thin circuit board with a solder mask layer formed on a surface thereof according to the present invention.

FIG. 3 shows structure of a thin circuit board according to a first embodiment of the present invention. As shown in FIG. 3, a solder mask layer 3 is formed on the surface 21*b* of the dielectric layer 21 where the circuit layer 24 is formed so as to cover the dielectric layer 21 and the circuit layer 24. As a result, a double-sided thin circuit board is formed, which can be used as a package substrate in FCBGA (flip chip ball grid array) package. FCCSP (flip chip chip-scale package). PBGA (plastic ball grid array) package, CSP (chip size package) or used as a printed wiring board (PWB) in electric products.

Second Embodiment

Figure 4:
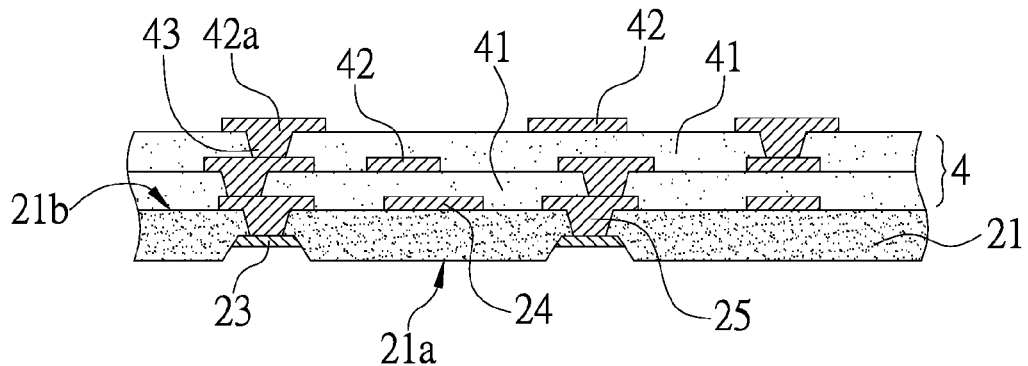
FIG. 4 is a cross-sectional view of a thin circuit board with a build-up circuit structure according to the present invention.

FIG. 4 shows structure of a thin circuit board according to a second embodiment of the present invention. As shown in FIG. 4, a build-up circuit structure 4 is formed on the surface 21*b* of the dielectric layer 21 where the circuit layer 24 is formed. The build-up circuit structure 4 includes at least one dielectric layer 41; a circuit layer 42 with a plurality of connecting pads 42*a* formed on the surface of the dielectric layer 41; and a plurality of conductive vias 43 formed in the dielectric layer 41 and electrically connected with the circuit layer 42, thereby forming a multi-layer circuit board. The multi-layer circuit board can be used as a package substrate as mentioned in the first embodiment or used as a printed wiring board in electric products.

Third Embodiment

Figure 5:
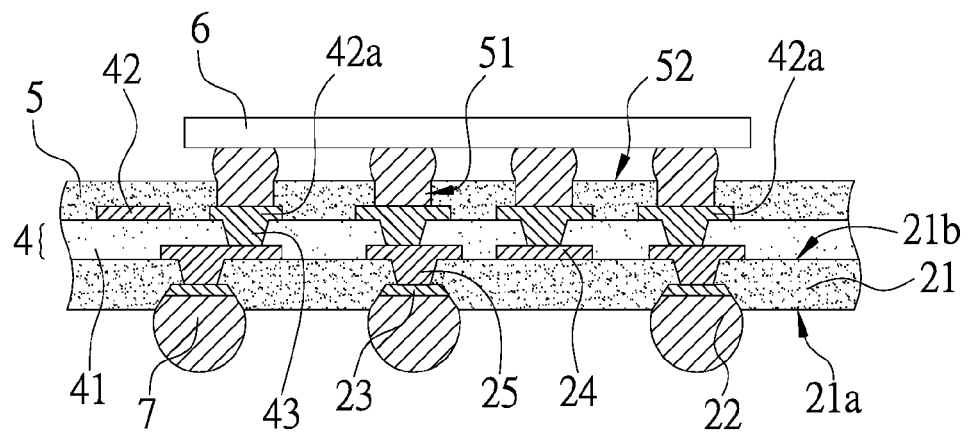
FIG. 5 is a cross-sectional view of a thin circuit board used as a flip chip package substrate according to the present invention.

FIG. 5 shows a thin circuit board structure, which is used as a package substrate. As shown in FIG. 5, a build-up circuit structure 4 is formed on the surface 21*b* of the dielectric layer 21 according to the second embodiment and a solder mask layer 5 is formed on the surface of the build-up circuit structure 4. A chip receiving area 52 is formed on the surface of the solder mask layer 5, which has a plurality of openings to expose the connecting pads 42*a* of the circuit layer 42. A semiconductor device 6 such as a chip or a passive component can be disposed on the chip receiving area 52 and electrically connected with the build-up circuit structure 4 through the connecting pads 42*a*, thereby forming a flip chip structure. Also, a conductive element 7 such as a solder ball, a conductive bump or a pin can be formed in the cavity 22 of the dielectric layer 21 and bonded to surface of the metal pad 23.

By using the conductive vias 25 to electrically connect the circuit layer 24 with the metal pad 23, the present invention eliminates the use of plated through holes that are formed by drilling the core board. In addition, by using the dielectric layer 21 as an outer protection layer, the conductive element 7 can be directly planted on the metal pad 23 in the cavity 22 without the need of disposing build-up circuit structure and solder mask layer. As a result, a thin circuit board is achieved, which can provide fine pitch circuit and simplify fabrication process. Further, the fabrication cost can be reduced.

Fourth Embodiment

Figure 6:
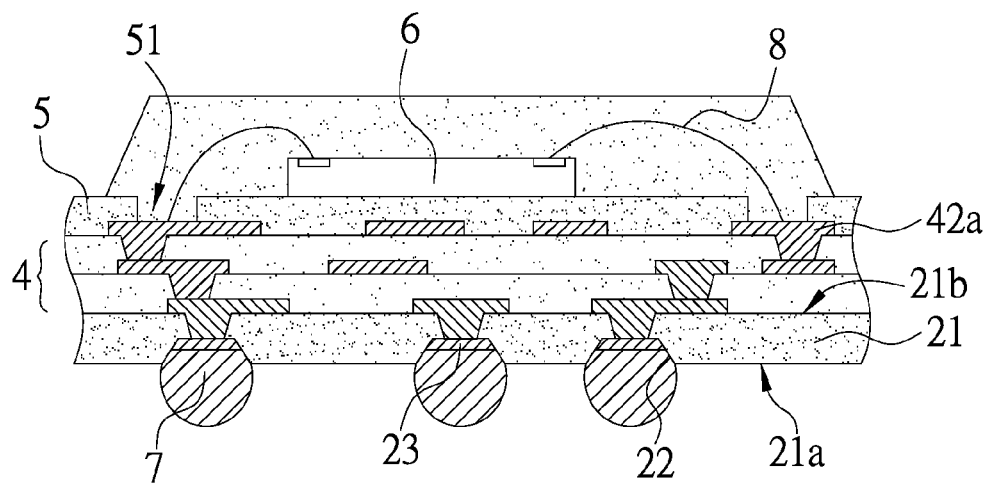
FIG. 6 is a cross-sectional view of a thin circuit board used as a wire bond package substrate according to the present invention.

Referring to FIG. 6, the structure of the thin circuit board in the fourth embodiment is similar to the structure in the third embodiment. The main difference of the fourth embodiment from the third embodiment is the connecting pads 42*a* are disposed outside the chip receiving area 52 instead of inside the chip receiving area. The semiconductor device 6 is adhered to the surface of the chip receiving area 52 by bonding material and electrically connected with the connecting pads 42*a* through bonding wires 8, and the semiconductor device 6 and the bonding wires 8 are encapsulated with encapsulation material 9. Such a structure can be used as a wire bond package substrate, which can provide fine pitch circuit and simplify the fabrication process. Further, the fabrication cost can be reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A thin circuit board, comprising:
   a dielectric layer with at least one cavity formed on a surface thereof without penetrating the dielectric layer;
   a metal pad formed in the cavity;
   a conductive element formed in the cavity and bonded to a surface of the metal pad;
   at least one circuit layer formed on another surface of the dielectric layer;
   a plurality of conductive vias formed in the dielectric layer for interconnecting the dielectric layer and the metal pad, so as for electrically connecting the circuit layer to the metal pad;
   a solder mask layer formed on the circuit layer and the surface of the dielectric layer; and
   a chip receiving area formed on the solder mask layer and having a plurality of openings to expose the circuit layer.

2. The thin circuit board of claim 1, wherein the dielectric layer is one of a rigid board and a flexible board.

3. The thin circuit board of claim 1, wherein the dielectric layer is made of a material selected from the group consisting of organic polymer material, ceramic material, and polymer material filled with ceramic powders.

4. The thin circuit board of claim 1, wherein the metal pad is made of a material selected from the group consisting of gold (Au), nickel (Ni), palladium (Pd), silver (Ag), tin (Sn), Ni/Pd alloy, chromium (Cr)/titanium (Ti) alloy, Ni/Au alloy, copper (Cu)/Ni/Au alloy, Pd/Au alloy, Ni/Pd/Au alloy, Cu, Cr, Ti, Cu/Cr alloy, and Sn/lead (Pb) alloy.

5. The thin circuit board of claim 1, further comprising a build-up circuit structure is formed on the surface of the dielectric layer where the circuit layer is formed.

6. The thin circuit board of claim 5, wherein the build-up circuit structure comprises:
   at least one dielectric layer;
   a circuit layer formed on a surface of the dielectric layer of the build-up circuit structure and having a plurality of connecting pads; and
   at least a plurality of conductive vias formed in the dielectric layer of the build-up circuit structure and electrically connected to the metal pads formed in the cavities of the dielectric layer.

7. The thin circuit board of claim 6, wherein the solder mask layer is formed on a surface of the build-up circuit structure, and the openings further expose the connecting pads of the circuit layer.

8. The thin circuit board of claim 7, wherein the connecting pads are for electrically connecting a semiconductor device to the build-up circuit structure.

9. The thin circuit board of claim 8, wherein the semiconductor device is one of a flip chip and a passive component.

10. The thin circuit board of claim 8, wherein the solder mask layer is formed on a surface of the build-up circuit structure, and a chip receiving area is formed on a surface of the solder mask layer, allowing the semiconductor device to be mounted on the chip receiving area.

11. The thin circuit board of claim 10, wherein the semiconductor device is electrically connected to the connecting pads by bonding wires.

12. The thin circuit board of claim 10, wherein the semiconductor device is one of a chip and a passive component.

13. The thin circuit board of claim 1, wherein the conductive element is one of a solder ball, a metal bump and a pin.

* * * * *